United States Patent [19]

Ferguson et al.

[11] Patent Number: 4,721,906

[45] Date of Patent: Jan. 26, 1988

[54] ONE STEP RMS SYSTEM

[75] Inventors: Hugo S. Ferguson, Averill Park; David L. Hollinger, East Greenbush, both of N.Y.

[73] Assignee: Duffers Scientific, Inc., Troy, N.Y.

[21] Appl. No.: 763,095

[22] Filed: Aug. 6, 1985

[51] Int. Cl.$^4$ .......................................... G01R 19/02
[52] U.S. Cl. .................................. 324/132; 219/110; 324/127; 364/483
[58] Field of Search ....................... 324/132, 142, 127; 364/483, 571, 733, 734; 219/110

[56] References Cited

U.S. PATENT DOCUMENTS 3,289,079 11/1966 Ferguson ............................ 364/483
4,283,678 8/1981 Halter ............................... 324/127 X

OTHER PUBLICATIONS

Clarke et al., "Principles and Theory of Wattmeters...", Phys. E.: Sci. Instrum. (G.B.), vol. 15, 1982, pp. 645-652.
Hill et al., "Design of a Microprocessor-Based Digital Wattmeter", IEEE Trans. on Ind. Electr. & Contr. vol. IECI-28, No. 3, Aug. 1981, pp. 180-184.
Cook et al., "A Microcomputer Based Weld Signal Processing and Data Logging System," Proc. of Southeastcon '78 Region 3 Conference, Atlanta, Ga., Apr. 10-12, 1978, pp. 456-461.
Matouka, "A Wide-Range, Digital Power/Energy Meter for Systems with Non-Sinusoidal Waveforms", IAS Annual Meeting 1980, Cincinnati, Ohio, Sep. 28-Oct. 3, 1980, pp. 838-849.

Primary Examiner—Reinhard J. Eisenzopf
Assistant Examiner—Stephen M. Baker
Attorney, Agent, or Firm—Pennie & Edmonds

[57] ABSTRACT

Apparatus for determining the root-mean-square value of a pulsatile signal generated from a power line signal. Samples of the pulsatile signal are produced at predefined substantially equal sampling intervals beginning at substantially the onset of a pulse in said pulsatile signal and continuing thereafter for substantially the entire duration of a half period of the power line signal to generate corresponding sampled values. The sampled values are squared and accumulated, then divided by the total number of samples taken and accumulated during said half period to yield an intermediate value for which the square root is determined, resulting in the root-mean-square value of the pulsatile signal.

20 Claims, 4 Drawing Figures

ONE STEP RMS SYSTEMg

FIELD OF INVENTION

The invention relates to root-mean-square (RMS) measurements and, more particularly, to one step RMS measurements of first differential waveforms.

BACKGROUND OF THE INVENTION

The measurement of root-mean-squared (RMS) values in both AC and DC waveforms has been substantially simplified in recent years through the development of RMS microchips, such as the BURR BROWN 4340 and 4341 True RMS-to-DC conversion integrated circuits (BURR BROWN is a registered trademark of the Burr-Brown Research Corporation principally located in Tucson, Ariz.). These units, which are each a single microchip, provide a DC output equal to the RMS value of the input waveform. When the time over which the measurement is being made is long compared to the individual perturbations of the waveform, the averaging time is substantial and the output is a very precise measurement. However, as the averaging time is shortened, and the duration of each perturbation approaches the overall measurement time, the measured value becomes less accurate.

Previously, the RMS measurement of waveforms having a short time duration and only a few perturbations was made using special dedicated RMS circuits. U.S. Pat. Nos. 3,201,688 and 3,289,079, which are incorporated herein by reference, disclose systems for measuring waveforms of a short duration where the base frequency of the perturbations is known and fixed. Using such circuits, RMS measurements can be made on a single perturbation or pulse, while relating the RMS value to waveforms having a plurality of similar perturbations with the same fixed base frequency. However, when the base frequency of the perturbations is not known or is variable, the circuits disclosed in these patents are not suitable. Additionally, such circuits operate properly only when the waveform to be measured is sinusoidal, or nearly sinusoidal.

The measurement of RMS values of current in high current heating and welding circuits requires special consideration. The signal may typically be measured by using a high current shunt, a Hall effect transducer, a current transformer, or an air core toroid coil (or Rogowski coil or belt). All of these methods have limitations. The high current shunt is expensive, difficult to mount in most systems, and because it is physically large, the shunt disturbs the circuit by increasing the physical size of the system. The Hall effect transducer is position sensitive, temperature sensitive and has a limited linear range. The high current transformer is expensive, bulky, has a limited linear range, and disturbs the circuit. The air core toroid coil, however, is economical, small in size, easy to locate in the circuit, disturbs the circuit very little, is linear over a very large range, but, however, provides an output proportional to the first differential with respect to time of the current in the monitored circuit. Therefore, in using air core toroid coils, it is usually necessary to integrate the first differential waveform generated by the air core toroid coil in order to obtain the current waveform before the RMS value is determined.

There are many instruments which measure RMS values of short duration AC pulses of high current at power line frequency using an air core toroid coil to obtain an input signal. In all cases, some form of electrical integration is used prior to deriving the RMS value. The only exception occurs where the waveform is a pure sine wave yielding a cosine wave output from the air core toroid coil. In this case, the differential is equal to the initial waveform except for a shift in phase.

There are generally two types of integrators, passive and active, each of which have advantages and limitations. Passive integrators are very stable but have very low output. Active integrators have high output, some DC drift, limited frequency range, and, when used for integration of signals with very low frequencies, often have an output that has low frequency oscillation resulting in a "rocking" output. In order to obtain RMS measurements, active integrators are primarily used followed by some form of dedicated RMS integrated circuit.

In most presently used high current systems, the current level is controlled by using a high current silicon controlled rectifier (SCR) switch to turn the current system on a short time after each half cycle of power line voltage has begun. This system, however, yields a current output for less than a full half cycle for each half power line voltage cycle. Since the measured RMS current value is used in controlling the current to the circuit, a device that generates RMS current values must be accurate. In order to obtain accurate RMS current values, the current must be measured for the whole half cycle, not merely that portion of the cycle when the current is not equal to zero. If the RMS current is determined during a half cycle only when the current is non-zero, the resultant RMS current value is greater than the true RMS current value, and accurate control of the current through the circuit cannot be achieved.

SUMMARY OF THE INVENTION

In the one step RMS system of the present invention, an air core toroid coil is used to measure the first differential with respect to time of a current signal waveform. Since the output from the air core toroid coil (or Rogowski coil or belt) is the first differential with respect to time of the current waveform, it is necessary to integrate this signal to obtain the current waveform. In the one step RMS system of the present invention, the current waveform is not electrically but mathematically integrated, thus eliminating all the deficiencies associated with the use of active and passive electrical integrators, including the limitation of operating frequency range. The use of the air core toroid coil provides all the advantages associated with the use of this particular transducer. The elimination of the electrical integration step to obtain the current waveform reduces the cost of the system, allows the measurement of RMS values on short time DC, time varying DC, and any frequency AC signals, allows the RMS measurement on any wave shape, and eliminates the rocking problems associated with low frequency operation of active integrators.

Accordingly, the RMS system of the present invention provides a simple and inexpensive system to obtain the RMS value of analog current waveforms which can have low frequencies, few perturbances, high amplitude, or a short time duration. Additionally, the present invention provides an RMS value of a waveform in one step directly from the first differential of the waveform without employing the second step of electrically integrating the first differential waveform. Furthermore, the RMS values obtained are independent of the time base of the measured waveform.

These and other objects are achieved in accordance with the present invention by determining the RMS value directly from the first differential waveform generated by an air core toroid coil without first electrically obtaining the current waveform. The RMS value of a waveform or part thereof is determined by converting the signal into digital form and by sampling the first differential of the waveform generated by the air core toroid coil. The sampling and conversion is done N times per piece of waveform or time period being analyzed. As each sampling and conversion is completed, the digital number, representing the instantaneous value of the amplitude of the differential waveform, is used to determine the instantaneous value of the current at that time. This current value is squared and added to the sum of the prior squared values. Each squared value is summed until N samplings and conversions have been made. At this point, the final total is divided by N, and the square root is then taken to obtain the RMS value. Using this procedure, there is no limitation placed on N, which may range from one to a very large number. Additionally, the waveform may have any configuration or frequency.

In accordance with a specific embodiment of the present invention, the high current flow of a single phase resistance welding machine is measured by an air core toroid coil. The output of the coil is applied directly to the input of an Analog-to-Digital (A/D) converter contained within a microcontroller large scale integrated circuit. The microcontroller is a complete microprocessor system including an internal timer and input/output (I/O) ports. The internal timer of the microcontroller causes the A/D converter to operate at predetermined time intervals. Each time the A/D converter completes a conversion, the digital word is stored in random access memory (RAM). The value is then used to determine the instantaneous value of the current. After squaring, the squared value is added to the prior stored sum of squared values and stored in RAM. When N conversions have been completed, the last sum of squared values is divided by N, and the square root of the result is taken thus resulting in the RMS current. In the case of the single phase welder, the N count is synchronized to the line voltage used to operate the welder. Since during a weld pulse the current generally flows during only part of each half cycle, some of the instantaneous current values for each half cycle will be zero. However, since N is chosen to encompass the entire half cycle, the RMS value calculated will be based on the whole half cycle time period not merely a part of the half cycle time period. By using the entire half cycle time period, measurements made on only a small fraction of a half cycle will correspond to measurements made on longer weld pulses of more than one half cycle.

Another feature of the present invention is that the number of samplings N and the time between samplings of the differential signal can be independent of the particular waveform. The choice of N determines the resolution of the calculated values. As N is increased and the time between samplings is reduced, the RMS value approaches the amplitude of the current waveform for the short evaluation period. The choice of the time period between each of the N samplings determines the period over which the RMS value is obtained. Thus, the RMS value for any part of a waveform comprised of pulses of long duration may be determined.

BRIEF DESCRIPTION OF THE DRAWINGS

These and other objects, features and advantages of our invention will be more readily apparent from the following detailed description of a preferred embodiment of the invention in which.

DESCRIPTION OF THE PREFERRED EMBODIMENT

Figure 1:
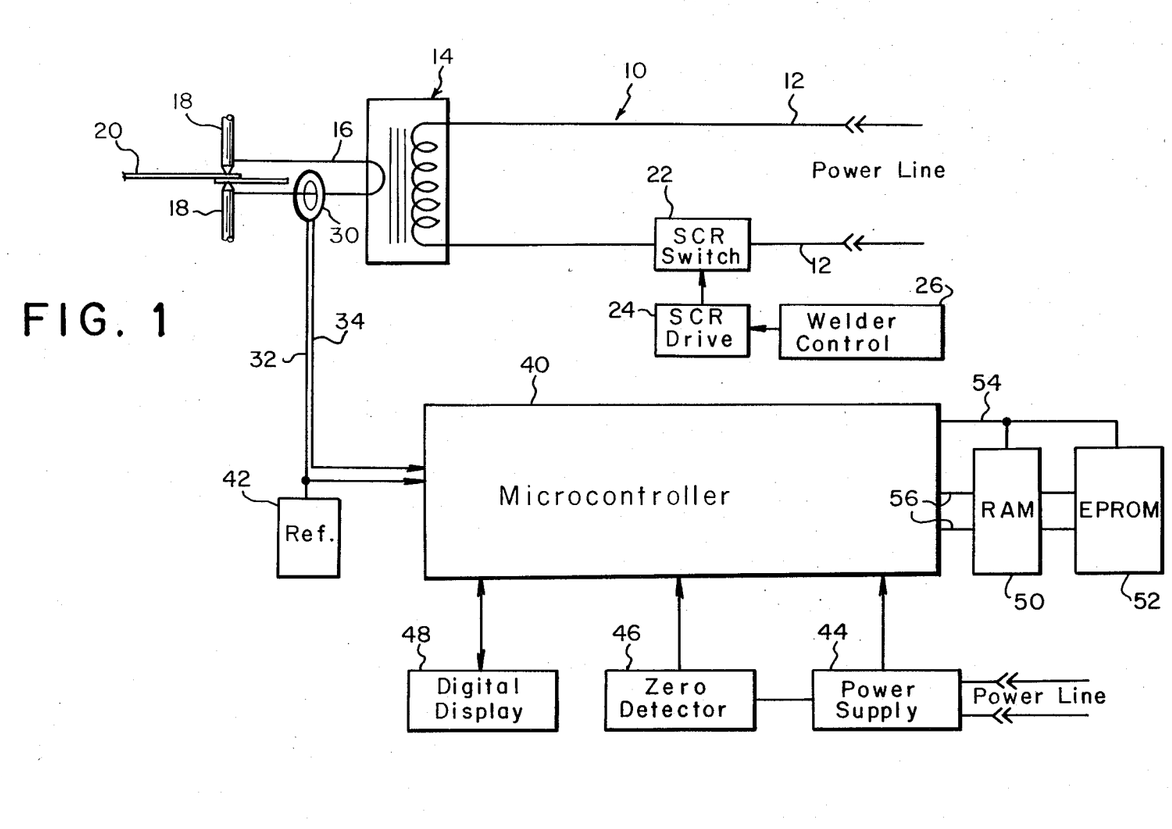
FIG. 1 is a schematic diagram of an embodiment of the one step RMS system used with a single phase resistance welder.

FIG. 1 depicts a schematic diagram of an embodiment of the one step RMS system of the present invention used with a single phase resistance welder, an air core toroid coil, and a microcontroller which embodies the teachings of the present invention. The present invention can also be used to measure RMS current values of other systems such as, for example, electrical heating systems and power lines.

Referring to FIG. 1, a single phase resistance welder 10 is provided with electric power by a pair of power lines 12. A transformer 14 steps down the power line voltage and increases the electrode current which is provided to secondary circuit 16 and electrodes 18 which heat workpieces 20. Since the electrode current passing through secondary circuit 16 is the current that is to be measured and controlled, the RMS value of this current must be determined. The power line voltage provided to transformer 14 is controlled by SCR switch 22, drive 24, and welder control 26. Power lines 12, transformer 14 and SCR switch 22 comprise a primary circuit. An air core toroid coil 30 (also known as a Rogowski coil or belt) surrounds a portion of secondary circuit 16 and may be located at any point in secondary circuit 16. The electrode current typically has a fixed current frequency and a fixed current period. The changes in the electrode current passing through secondary circuit 16 induces an electro-magnetic force (EMF) within the toroid of air core toroid coil 30. This EMF causes a differential current signal to be generated by the coil of air core toroid coil 30 which is proportional to the rate of change of the magnetic field induced by the electrode current flowing in secondary circuit 16. Thus the differential current passing through the coil of air core toroid coil 30 is proportional to the first differential with respect to time of the electrode current passing through secondary circuit 16. Alternatively, other devices which produce a first differential current signal can be used instead of an air core toroid coil.

The signal from the air core toroid coil 30 is fed through lines 32 and 34 to the input of microcontroller 40. A reference system 42 provides a voltage equal to one half of the input signal excursion allowed by microcontroller 40. Illustratively, microcontroller 40 is an MCS®-96 (8096) microcontroller or an MCS®-97 (8097) microcontroller manufactured by the Intel Corporation of Santa Clara, Calif. although other microcontrollers or other similarly functioning devices can be used. Microcontroller 40 typically has an input signal range of about 0 to about 5 volts. Accordingly, reference system 42 is set at about 2.5 volts so that signals of equal positive and negative amplitude may be measured by microcontroller 40. The input signal on lines 32 and 34 can alternatively be rectified to a single polarity thus eliminating the need for reference system 42. This alternative would, however, increase the analog to digital conversion range by one bit and may add some inaccuracy and introduce some DC drift into the system.

Supporting the operation of the microcontroller 40 is power supply 44 and associated zero crossing detector 46. Zero crossing detector 46 provides a pulse of length equal to the time length of one half cycle of the power line frequency. This signal is used to initiate the correct time base for calculating the RMS current of secondary circuit 16. Digital data display 48 is used to display the RMS current value calculated by microcontroller 40. There are many types of digital displays suitable for operation from the microcontroller port; however, the resolution of the digital display 48 is to be chosen to adequately resolve the data gathered by microcontroller 40.

Random access memory (RAM) 50 and erasable programmable read only memory (EPROM) 52 provide the necessary memory for the operation of microcontroller 40. The software system which controls microcontroller 40 and which is depicted in flow diagram form in FIGS. 2 and 3 and described in detail below is preferably stored in EPROM 52. RAM 50 is preferably used to store the running values of the different parameters measured and calculated as explained in detail below. RAM 50 and EPROM 52 are connected to microcontroller 40 via control lines 54 and data address bus 56. Microcontroller 40 contains, among other elements, an analog to digital (A/D) converter, a high speed input to output (I/O) port, and a timer. The A/D converter samples the input signal received on lines 32 and 34 at preselected time intervals, as discussed in detail below, and converts the input analog signal into a digital signal. This digital signal is then fed to the other elements of microcontroller 40.

Figure 2:
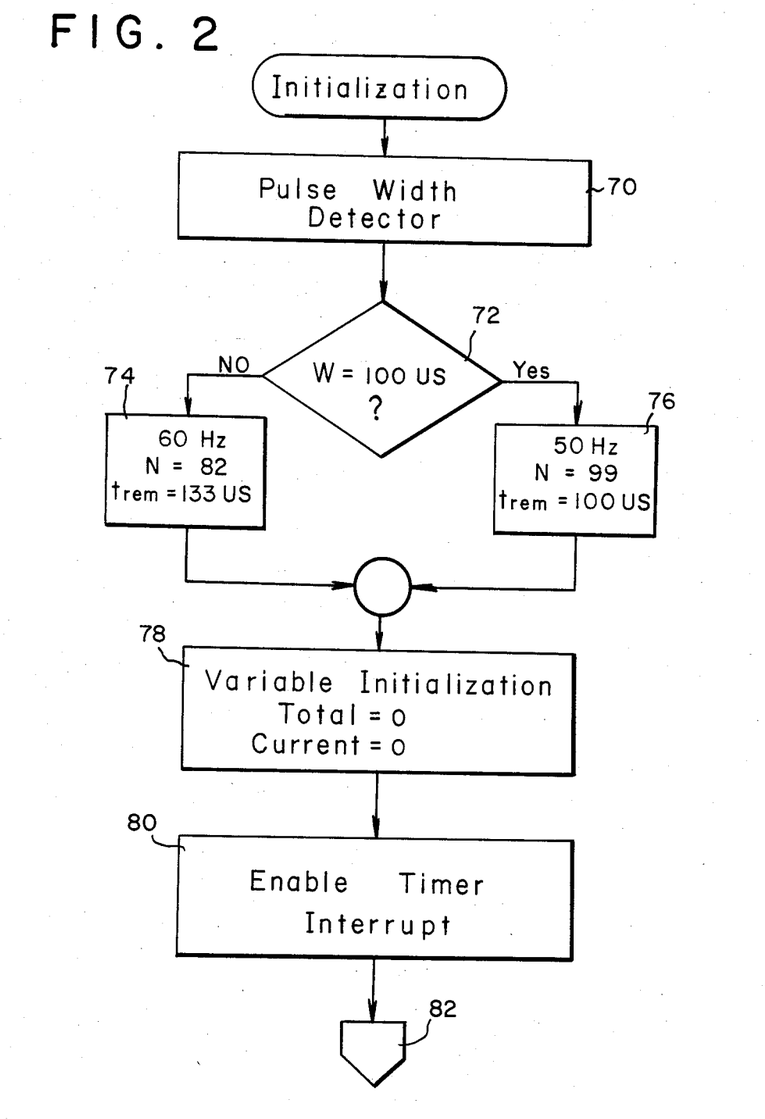
FIG. 2 is a flow diagram describing the initialization procedure used in an embodiment of the one step RMS system of the present invention.
Figure 3:
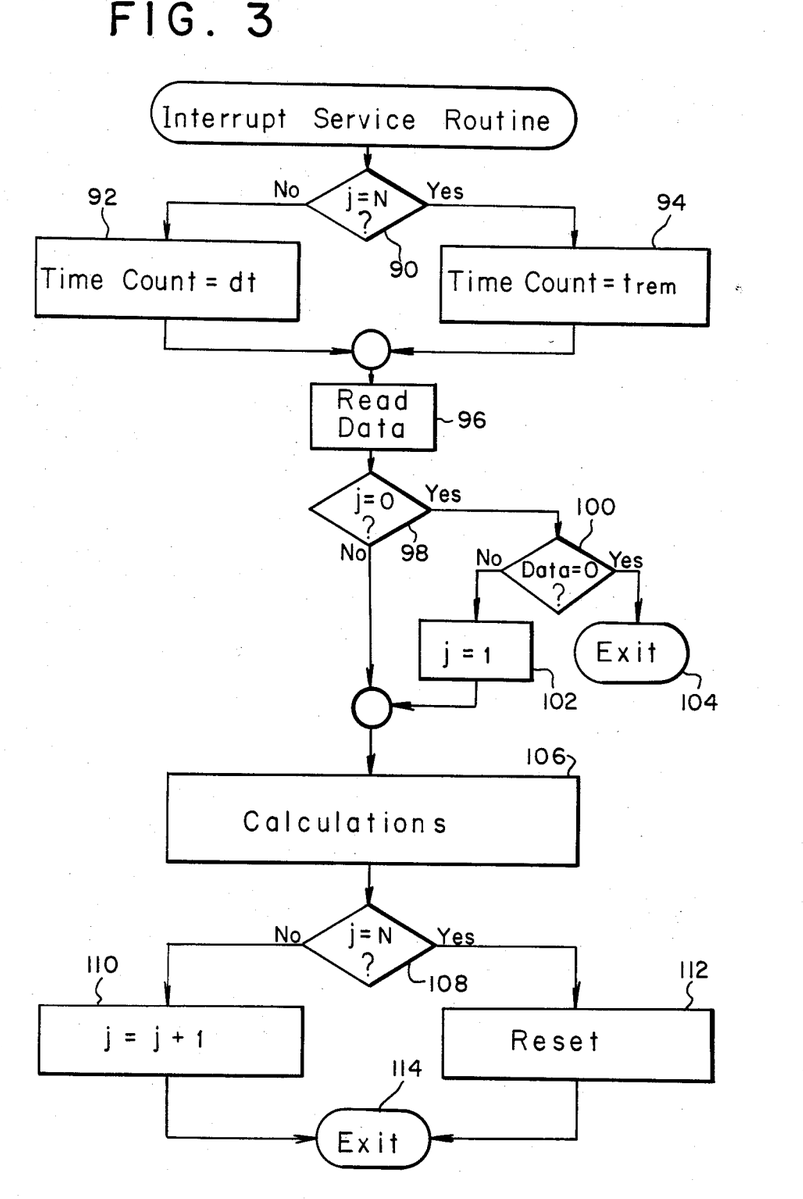
FIG. 3 is a flow diagram of the time based interrupt service routine of an embodiment of the one step RMS system of the present invention.

The flow diagrams shown in FIGS. 2 and 3 depict a software system which implements the one step RMS system of the present invention and is capable of measuring an RMS current. A hardware system as shown in FIG. 1 can be used to implement the software system shown in FIGS. 2 and 3. In particular, the hardware system must have the capability to convert an analog signal to digital form, measure a pulse width, execute a time based interrupt, and perform the various mathematical calculations within the given time constraints. As previously discussed, an Intel MCS® 97 has these capabilities and has been disclosed as a typical hardware system.

Figure 4:
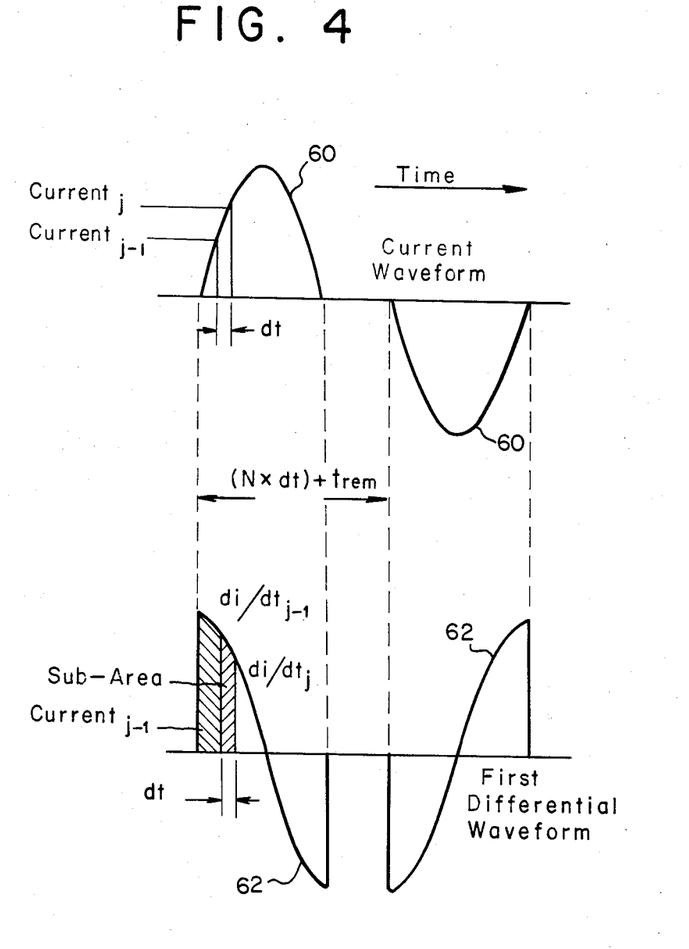
FIG. 4 is a graphical representation of one cycle of a typical input waveform and the first differential of this waveform analyzed by the one step RMS system of the present invention.

In FIG. 4, waveform 60 is an example of a current waveform plotted as a function of time. Although waveform 60 has a fixed known current frequency and a fixed known current period, other waveforms with unknown current frequencies and unknown current periods can be measured. The waveform produced by air core toroid coil 30 is shown as waveform 62. Waveform 62 is thus the first differential with respect to time of waveform 60. By sampling the magnitude of waveform 62 through the A/D converter of microcontroller 40, the software will calculate the RMS value of waveform 60 at predetermined intervals each of which is illustratively equal to one half current period or one pulse period which, as discussed below, is equal to $(N \times dt) + t_{rem}$. The system described here samples waveform 62 at fixed time intervals dt. Every time waveform 62 is sampled, the software system calculates the current value at that time ($CURRENT_j$) and adds the square of the current to a running sum ($TOTAL_j$). The number N of samples taken determines the accuracy of the system. The specific calculations used to determine the RMS current are described in detail with reference to the flow diagrams of FIGS. 2 and 3.

The flow diagram shown in FIG. 2 represents a preferred software system which is used to initialize the RMS system of the present invention. This initialization is necessary only at power up time, and does not need to be implemented every time an RMS measurement is calculated. Block 70 measures the width of one half cycle of the power line base frequency. This can be done easily using the high speed I/O port of microcontroller 40 coupled to zero detector 46 which outputs a pulse of time width equal to one half cycle. The time of a pulse period or one half current cycle allows microprocessor 40 to determine the base frequency of the power signal on power lines 12 (and therefore that of the current in secondary circuit 16) to be measured.

In decision block 72, it is determined whether the current frequency is 60 Hz or 50 Hz. Other frequencies can be accommodated with suitable changes in the software which would be obvious to those skilled in the art. In addition, the software can be modified so that the measurement of current in secondary circuit 16 is independent of the frequency or shape of the current waveform as discussed in greater detail below. Block 74 initializes the time base dependent variables for 60 Hz operation, while analogously block 76 does the same for 50 Hz operation. In particular, these variables are: the number of samples N to be taken per pulse period or one half cycle, and an associated remainder time ($t_{rem}$) for the particular operation frequency. N is determined based on a fixed sampling time interval dt of 100 microseconds. The remainder time $t_{rem}$ is used to ensure that the system is synchronized with the incoming waveform 60 and 62. Thus, in the case of 50 Hz operation, N is set equal to 99 and $t_{rem}$ is set equal to 100 us. This choice of N and $t_{rem}$ is made to match the duration of a pulse period which is equal to: $(N \times dt) + t_{rem} = (99 \times 100 \text{ us}) + 100 \text{ us} = 10,000 \text{ us}$. Although the duration of a one half cycle or pulse period (10,000 us) is equally divisible by dt=100 us if N=100 thus making it unnecessary to use $t_{rem}$, a value of 99 is chosen for N and a value of 100 us is chosen for $t_{rem}$ so that a $t_{rem}$ is required. This requirement allows the subroutine to be easily converted to operate for different current or corresponding power line frequencies as will become more apparent from the following description.

For 60 Hz operation, a value for $t_{rem}$ is necessary because the duration of one half cycle (8333 us) is not evenly divisible by dt=100 us. In order to keep the system synchronized to 60 Hz, the last sampling time is stretched to 133 us. This choice of N and $t_{rem}$ results in a total one half cycle time or pulse period of $(82 \times 100 \text{ us}) + 133 \text{ us} = 8333 \text{ us}$. In fact, N could be chosen as 83 and a remainder time of 33 us could be used, but this choice of N and $t_{rem}$ would result in the processor having to be able to complete sample calculations in a shortened time period of 33 us. By using N=82, this time constraint is loosened, and the processor is given more than 100 us to complete all necessary calculations. The appropriate values of N and $t_{rem}$ are then preferably stored in RAM 50 for later use by microcontroller 40. For other operating frequencies, other values of N and $t_{rem}$ can be chosen.

In variable initialization block 78, the variables used in the main program are initialized by setting their values equal to zero and preferably storing these values in RAM 50. These variables are: $TOTAL_0$, the running sum of the squares of the current; $CURRENT_0$, the value of the current waveform at time zero; j, the counter used to keep track of the number of samples already taken of the waveform during a one half cycle; and $di/dt_0$, the value of the first differential waveform 62 at time zero.

Block 80 represents enabling the time based interrupt for the first time. This interrupt is determined by the timer and the I/O port of microcontroller 40. The timer is a counter that is always running in microcontroller 40. The software sets up an interrupt based on the count in the timer. When the timer reaches the specified count, an interrupt occurs. By reading the count in the timer and then adding some offset to that count, a relative time based interrupt is generated. The interrupt enabled in block 80 will be generated 100 us from the time it was enabled.

The initialization routine is complete once the timer interrupt is enabled. The interrupt service routine for the timer interrupt enables the next timer interrupt and handles all calculations involved in determining the RMS current. Because this system is interrupt controlled, a foreground task such as keeping statistics on the values of RMS current, or display of data can be implemented. The offpage reference block 82 in FIG. 2 represents entry into such a foreground task.

The flow diagram shown in FIG. 3 represents the interrupt service routine for the time based interrupt. Every time the interrupt is generated, data is sampled from air core toroid coil 30 and possibly used in calculations as explained in detail below.

The first step in the interrupt service routine as shown in FIG. 3 is to enable the next interrupt. Decision 90 determines whether j=N. If j is equal to N, this interrupt is the last interrupt, and therefore the last sample of data for one half cycle is currently being measured. This condition indicates that the next interrupt should be enabled with time count equal to $t_{rem}$. This ensures that the processor stays synchronized with the one half cycle time of current waveform 60. Block 94 represents this action. Block 92 is for the case when j is not equal to N. The time based interrupt is enabled for time count=dt which is equal to 100 us. This means that the next interrupt will occur at a time 100 us after the previous interrupt occurred.

Block 96 represents the process of sampling the data from air core toroid coil 30. This process is accomplished by converting the analog value from coil 30 into digital form using the A/D converter of microcontroller 40. Once the conversion is complete, the data is read from the A/D converter into system RAM 50.

Blocks 98, 100, 102 and 104 of FIG. 3 implement the startup of the measuring system. The program waits until a significant, non-zero, value is read from air core toroid coil 30 to start the measuring process. By doing this, the one half cycle measurement process is synchronized to the beginning of the current pulse.

Decision block 98 checks whether the measuring process has already begun. If the process has not yet begun (j=0), decision block 100 determines whether the value of data just read from air core torid coil 30 should start the process. If the value of the data read is equal to zero, the current pulse has not yet started and exit 104 returns control of the processor to the foreground routine. If the value of the data read is not equal to zero, the measuring process begins. This is shown in block 102 by assigning the value of 1 to j in RAM 50. This means that detection of the first significant data value from air core toroid coil 30 during the present one half cycle has occurred.

At block 106 the actual calculations are performed every time data is sampled from air core coil 30 during the measuring process. The value of the DATA read from the coil is assigned to $di/dt_j$:

$$di/dt_j = DATA$$

This is the value of the differential waveform 62 at time $j \times dt$ and is preferably stored in RAM 50 for later processing. Next, the area $SUB\text{-}AREA_j$, as shown in FIG. 4, between $j \times dt$ and $(j-1) \times dt$ and below the differential waveform 62 is approximated by mathematical integration as follows:

$$SUB\text{-}AREA_j = [(di/dt_j + di/dt_{j-1})/2] \times dt$$

This value is preferably stored in RAM 50 and is added to the value of $CURRENT_{j-1}$ at time $(j-1) \times dt$, previously calculated, as follows:

$$CURRENT_j = CURRENT_{j-1} + SUB\text{-}AREA_j$$

This value is preferably stored in RAM 50 to be used the next time through the process. Finally, the square of $CURRENT_j$ is added to the value of $TOTAL_{j-1}$, to obtain $TOTAL_j$ which is a running sum of the squares of the CURRENT as follows:

$$TOTAL_j = TOTAL_{j-1} + [CURRENT_j]^2$$

The value of $TOTAL_j$ is then preferably stored in RAM 50.

When the first significant data value from air core toroid coil 30 has been detected for a new one half cycle as indicated in FIG. 3 at block 102 where a value of 1 is assigned to j, in block 106, since j=1, $SUB\text{-}AREA_1$ is calculated as follows:

$$SUB\text{-}AREA_1 = [(di/dt_1 + di/dt_0)/2] \times dt$$
$$= [(di/dt_1 + 0)/2] \times dt$$
$$= [(di/dt_1)/2] \times dt$$

Decision 108 then determines whether all N values for the waveform being measured have been processed which has occurred when j is equal to N. If j is not equal to N, then as block 110 shows, j is incremented by one and control of the processor is returned to the foreground routine. As previously explained, the processing of the foregound routine is interrupted at an interrupt time as set in blocks 92 or 94. When the foreground routine is interrupted, the interrupt service routine is processed beginning at block 90.

If j is equal to N, then all measurements for the waveform have been processed. The final calculation is made in block 112 to determine the RMS current by taking the sum of the squares of the currents TOTAL$_j$ which is equal to TOTAL$_n$, dividing TOTAL by N, and taking the square root of the result. This calculation results in a value for the RMS current I$_{RMS}$:

$$I_{RMS} = (TOTAL_N/N)^{\frac{1}{2}}$$

In block 112, the variables are also reset and reinitialized to zero for measurements in the next one half cycle. In particular, j, TOTAL, CURRENT, and di/dt are all set equal to zero and these values are stored in RAM 50. At this point, control of the processor is returned to the foreground routine as discussed above, the RMS current is displayed on digital display 48, and the next measurements on the next one half cycle will commence once the next non-zero data value is read from air core coil 30.

While the invention has been described in conjunction with specific embodiments, it is evident that numerous alternatives, modifications, variations, and uses will be apparent to those skilled in the art in light of the forgoing description. For example, the time between samplings dt can be changed to achieve higher or lower sampling rates depending upon the particular waveform to be measured, thus allowing the measurement of RMS values for a wide variety of waveforms. RMS values of waveforms of different frequencies can be measured by choosing the appropriate values for N and t$_{rem}$.

The software program used to implement the RMS system of the present invention can also be easily modified to obtain RMS values of current waveforms with only a single pulse, or waveforms comprised of several different pulses with different durations. For example, the current waveform can comprise three pulses, (which may or may not be repeated periodically), where the first pulse has a positive polarity and a duration of 0.5 seconds, the second pulse has a negative polarity and a duration of 1.0 seconds, and the third pulse has a positive polarity and a durtion of 0.5 seconds. Although this current waveform is a balanced waveform of several pulses, it is not symmetrically periodic like waveform 60 shown in FIG. 4.

Additionally, as mentioned above, the initialization software described in the flow diagram of FIG. 2 can be modified so that the measurement of the current in secondary circuit 16 is independent of the frequency or shape of the current waveform. This modification is useful, for example, when the current waveform to be measured is comprised of pulses which are equal to or greater than one half cycle of the power line frequency. If the waveform to be measured were comprised of pulses of several seconds in duration, it would be desirable to determine the RMS current more frequently than once for every pulse since more frequent monitoring of the RMS current may be desired. In such a case, the software in effect breaks the long pulses into segments and determines the RMS current for each segment. This can be accomplished by choosing particular values for N and t$_{rem}$ which do not necessarily depend upon the shape or frequency of the current waveform. Additionally, the interrupt service routine described in the flow diagram of FIG. 3 can then optionally be modified so that the RMS values determined for all of the segments of the long pulses are averaged to obtain the average RMS value for the each long pulse. Such a modification of the software permits the measurement of RMS current values for waveforms commonly found in frequency converters and "DC" welders. Since these machines have current pulses with durations that are longer than those of single phase welders, the above described modification of the software to measure segments of the pulses permits the measurement of RMS current values of these pulses even though the pulse duration may be arbitrary and may vary from one pulse to another.

What is claimed is:

1. Apparatus for determining the root mean square value of a pulsatile signal having an absolute value and generated from a power line signal, said power line signal having a known substantially fixed period, and wherein the absolute value of said pulsatile signal has a period substantially equal to half the period of said power line signal and a time duration equal to less than said half period, said apparatus comprising:

means for producing samples of the pulsatile signal at predefine substantially equal sampling intervals beginning at substantially the onset of a pulse in said pulsatile signal and continuing thereafter for substantially the entire duration of said half period to generate corresponding sampled values;

means, reponsive to said sample producing means, for squaring each of said sampled values to generate corresponding squared values;

means, operative in reponse to said squaring means, for accumulating each of said squared values to produce a totalized value;

means, reponsive to said squaring means, for dividing said totalized value by a number, wherein said number equals the total number of separate samples taken and accumulated during said half period to yield an intermediate value; and means, reponsive to said dividing means, for determining the square root of said intermediate value to yield said root means square value of said pulsatile signal.

2. The apparatus in claim 1 further comprising:
   means for ascertaining the period of said power line signal; and
   means for choosing a duration of said sampling interval to provide a desired resolution in said root mean square value.

3. The apparatus in claim 2 wherein said squaring means generates each squared value prior to the occurrence of each corresponding successively occurring sampled value; and said accumulating means adds each squared value to the totalized value prior to the occurrence of said next successively occurring sampled value.

4. The apparatus in claim 3 wherein said apparatus further comprises an air core pickup coil for providing said pulsatile signal, wherein said pulsatile signal is proportional to a first derivative of a measured current; and said sample producing means further comprises:

means for sampling said pulsatile signal, at predefined substantially equal sampling intervals beginning at substantially the onset of a pulse in said pulsatile signal and continuing thereafter for the substantially the entire duration of said half period, to yield corresponding digital values; and means for integrating each of said digital values to yield each of said sampled values, wherein each of said sampled values is proportional to an instantaneous value of said measured current.

5. The apparatus in claim 4 wherein said sampling interval has a duration of approximately 100 microseconds and said number equals the value 82 plus approximately 1.333 in the event said power line signal has a frequency of approximately 60 Hertz.

6. The apparatus in claim 4 wherein said sampling interval has a duration of approximately 100 microseconds, and said number equals the value 99 plus approximately 1 in the event said power line signal has a frequency of approximately 50 Hertz.

7. Apparatus for determining the root mean square value of pulsatile welding current, wherein said apparatus is responsive to a voltage signal generated across an air core pickup coil that provides a voltage proportional to a first derivative of said pulsatile welding current, said pulsatile welding current having an absolute value and being gernerated from a power line signal having a known substantially fixed period and the absolute value of said pulsatile welding current having a period substantially equal to less than said half period, said apparatus comprising:
 means for sampling the voltage signal at a pre-defined sampling interval to generate a corresponding sampled voltage value;
 means, responsive to said sampling means, for itegrating the correponding sampled voltage values to obtain a value of the corresponding welding current flowing during said sampling interval;
 means, operative in response to said integrating means, for squaring said welding current value to generate a corresponding squared value;
 means, reponsive to said squaring means, for summing said corresponding squared value with a prior accumulated squared value produced from an immediately preceding sampling interval to produce a totalized value prior to the occurrence of an immediately succeeding sampling interval;
 means for continuously repeating the sampling, integrating, squaring and totalizing at pre-defined substantially equal sampling intervals throughout substantially the entire duration of said half period; wherein said sampling begins at substantially a pulse in said voltage signal and continues thereafter for substantially the entire duration of said half period;
 means, reponsive to said accumulating means, for dividing said totalized value by a number, at the completion of said sampling during said half period, in order to yield an intermediate value, wherein said number equals the total number of separate samples taken and accumulated during said half period; and
 means, reponsive to said dividing means, for determining the square root of said intermediate value to yield said root mean square value of said pulsatile welding current.

8. The apparatus in claim 7 further comprising:
 means for ascertaining the period of said power line signal; and
 means for choosing a duration of said sampling interval to provide a desired resolution in said root mean square value.

9. The apparatus in claim 8 wherein said sampling interval has a duration of approximatedly 100 microseconds, and said number equals the value 82 plus approximately 1.333 in the event said power line signal has a frequency of approximately 60 Hertz.

10. The apparatus in claim 8 wherein said sampling interval has a duration of approximately 100 microseconds, and said number equals the value 99 plus approximately 1 in the event said power line signal has a frequency of approximately 50 Hertz.

11. A method for determining the root means square value of a pulsatile signal generated from a power line signal, said power line signal having a known substantially fixed period, and wherein said pulsatile signal has an absolute value and the absolute value has a period substantially equal to half the period of said power line signal and a time duration equal to less than said half period, said method comprising the steps of:
 producing samples of the pulsatile signal at predefined substanitially equal sampling intervals beginning at substantially the onset of a pulse in said pulsatile signal and continuing thereafter for substantially the entire duration of said half period to generate corresponding sampled values;
 squaring each of said sampled values to generate corresponding squared values;
 accumulating each of said squared values to produce a totalized value;
 dividing said totalized value by a number, wherein said number equals the total number of separate samples taken an accumulated during said half period to yield an intermediate value; and
 determining the square root of said intermediate value to yield said root mean square value of said pulsatile signal.

12. The method in claim 11 further comprising the steps of:
 ascertaining the period of said power line signal; and
 choosing a duration of said sampling interval to provide a desired resolution in said root mean square value.

13. The method in claim 12 wherein said squaring step further comprises the step of generating each squared value prior to the occurrence of each corresponding successively occuring sampled value; and said accumulating step further comprises the step of adding each squared value to the totalized value prior to the occurrence of said next successively occurring sampled value.

14. The method in claim 13 further comprising the step of generating said pulsatile signal using an air core pickup coil, wherein said pulsatile signal generated by said coil is proportional to a first derivative of a measured current; and said sample producing means further comprises:
 sampling said pulsatile signal, at pre-defined substantially equal sampling intervals beginning at substantially the onset of a pulse in said pulsatile signal and continuing thereafter for the entire duration of said half period, to yield corresponding digital values; and
 integrating each of said digital values to yield each of said sampled values, wherein each of said sampled values is proportional to an instantaneous value of said measured current.

15. The method in claim 14 wherein said sampling interval has a duration of approximately 100 microseconds, and said number equals the value 82 plus approximately 1.333 in the event said power line signal has a frequency of approximately 60 Hertz.

16. The method in claim 14 wherein said sampling interval has a duration of approximately 100 microseconds and said number equals the value 99 plus approximately 1 in the event said power line signal has a frequency of approximately 50 Hertz.

17. In welding control apparatus, wherein said apparatus is reponsive to a voltage signal generated across an air core pickup coil that provides a voltage proportional to a first derivative of pulsatile welding current, said pulsatile welding curent having an absolute value and being generated from a power line signal having a known substantially fixed period and the absolute value of said pulsatile welding current having a period substantially equal to half the period of said power line signal and a time duration equal to less than said half period, a method for determining the root mean square value of the pulsatile welding current; said method comprising the step of:

sampling the voltage signal at a pre-defined sampling interval to generate a corresponding sampled voltage value;

integrating the corresponding sampled voltage values to obtain a value of the corresponding welding current flowing during said sampling interval;

squaring said welding current value to generate a corresponding squared value;

accumulating said corresponding squared value with a prior accummulated squared value produced from an immediatedly preceding sampling interval to produce a totalized value prior to the occurrence of an immediately succeeding sampling interval;

integrating, squaring, and totalizing at pre-defined substantially equal sampling intervals throughout substantially the entire duration of said half period; wherein said sampling begins at substantially the onset of a pulse in said voltage signal and continues thereafter for substantially the entire duration of said half period;

dividing said totalized value by a number, at the completion of said sampling during said half period, in order to yield an intermediate value, wherein said number equals the total number of separate samples taken and accummulated during said half period; and determining the square root of said intermediate value to yield said root means square value of said pulsatile welding current.

18. The apparatus in claim 17 further comprising means for: ascertaining the period of said power line signal; and choosing a duration of said sampling interval to provide a desired resolution in said root mean square value.

19. The apparatus in claim 18 wherein said sampling interval has a duration of approxiamately 100 microseconds, and said number equals the value 82 plus approximately 1.333 in the event said power line signal has a frequency of approximately 60 Hertz.

20. The apparatus in claim 18 wherein said sampling interval has a duration of approximately 100 microseconds, and said number equals the value 99 plus approximately 1 in the event said power line signal has a frequency of approximately 50 Hertz.

* * * * *